United States Patent [19]

Candor

[11] 4,174,979

[45] Nov. 20, 1979

[54] METHOD OF STORING SOLAR ENERGY

[76] Inventor: James T. Candor, 5440 Cynthia La., Dayton, Ohio 45429

[21] Appl. No.: 894,827

[22] Filed: Apr. 10, 1978

[51] Int. Cl.$^2$ .......................... H01L 35/00; B03C 5/00
[52] U.S. Cl. ...................................... 136/206; 55/130; 204/186; 209/129
[58] Field of Search .................... 55/130; 126/270; 136/206; 204/186; 209/129

[56] References Cited

U.S. PATENT DOCUMENTS

| | | | |
|---|---|---|---|
| 3,396,097 | 8/1968 | Wolcott | 209/129 X |
| 3,487,610 | 1/1970 | Brown et al. | 55/130 |
| 3,783,588 | 1/1974 | Hudis | 55/126 |
| 3,966,575 | 6/1976 | Candor | 204/180 R |

OTHER PUBLICATIONS

Lindsley, Popular Science, vol. 206, Mar. 1975, pp. 88–90 and 145.

Primary Examiner—Leland A. Sebastian
Attorney, Agent, or Firm—Candor, Candor & Tassone

[57] ABSTRACT

A method of storing solar energy in the immediate vicinity of available solar energy comprising the steps of generating electrical current with the available solar energy and charging a strip of electret producing material directly with the electrical current so that the strip of material is changed into a strip of electret means that can be subsequently utilized to produce work, such as forming part of an electrostatic separator unit, whereby the available solar energy need not be transmitted in any form other than by the produced electret means.

10 Claims, 1 Drawing Figure

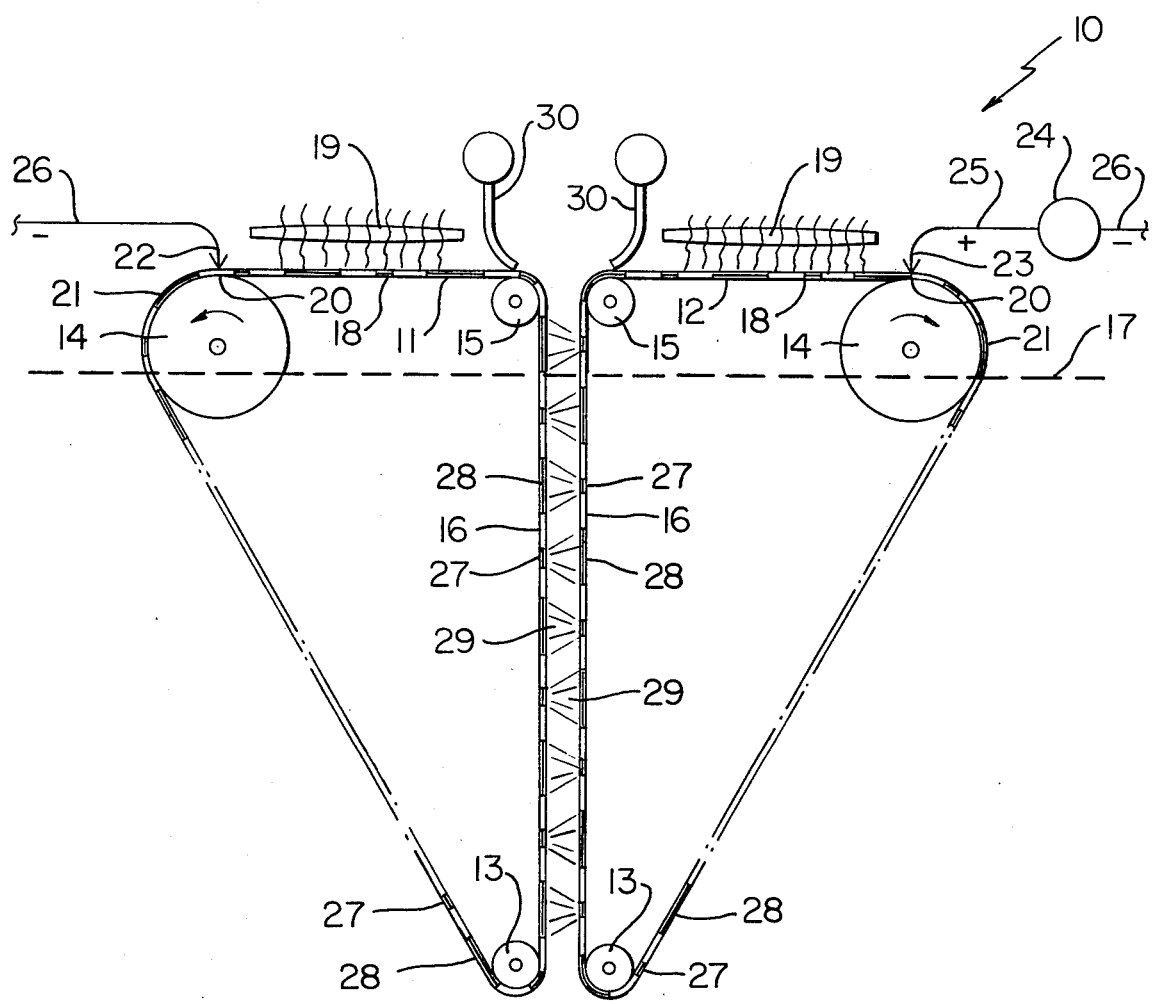

METHOD OF STORING SOLAR ENERGY

BACKGROUND OF THE INVENTION

1. Field of the Invention

This invention relates to a method of storing solar energy.

2. Prior Art Statement

It is well known to charge strips of electret producing material with electrical current to change the same into strips of electret means.

For example, see the following two items:
(1) U.S. Pat. N. 3,487,610 to Brown et al,
(2) U.S. Pat. No. 3,783,588 to Hudis.

Item (1) above appears to continuously form a strip of electret material by imposing an electrical charge against one side thereof while the strip of electret producing material is moving and is at 25° C. to change the material into electret means and the changed material is subsequently made into electrostatic filter means wherein the electret material itself separates particles from fluid passing through the electrostatic filter means by the resultant electrostatic field means created by the electret material.

Item (2) above appears to likewise form strips of electret material that is subsequently utilized to form electrostatic filtering means, item (2) first heating the electret producing material before charging the same with electrical current and thereafter cooling the material to change the same into electret means.

It is also well known to provide an electrostatic separation apparatus that has alternately arranged non-uniform fields created between two strips of electret material.

For example, see the following item:
(3) U.S. Pat. No. 3,966,575 to Candor.

Item (3) above creates a plurality of alternately arranged non-uniform electrostatic fields respectively between large and small charged electrodes so that material or fluid can be passed through the non-uniform fields to be acted upon by such non-uniform fields.

SUMMARY OF THE INVENTION

It is well known that one of the problems of collecting solar energy is to provide a suitable means of storing the collected solar energy until the same is needed.

It is a feature of this invention to suitably store available solar energy in the immediate vicinity thereof and in a manner that the same can be subsequently used for a useful purpose.

In particular, one embodiment of this invention provides means for converting available solar energy to an electrical current that can be directly utilized to change electret producing material into electret means which can be subsequently utilized to produce work, such as by forming an electrostatic separator unit for separting particles from a fluid passed through such unit, whereby the available solar energy need not be transmitted in any form other than by the produced electret means.

Accordingly, it is an object of this invention to provide a method of storing solar energy, the method of this invention having one or more of the novel features of this invention as set forth above or hereinafter shown or described.

Other objects, uses and advantages of this invention are apparent from a reading of this description which proceeds with reference to the accompanying drawing forming a part thereof and wherein:

BRIEF DESCRIPTION OF THE DRAWING

The drawing schematically illustrates one embodiment of the method and apparatus of this invention for storing solar energy and thereafter utilizing the same.

DESCRIPTION OF THE PREFERRED EMBODIMENT

While the various features of this invention are hereinafter described and illustrated as being particularly adapted to provide electrostatic filtering for a liquid, it is understood that the various features of this invention can be utilized singly or in any combination thereof to provide electret means for other uses as desired.

Therefore, it is to be understood that this invention is not to be limited to the embodiment illustrated in the drawing, because the drawing is merely utilized to illustrate one of the wide variety of uses of this invention.

Referring now to the drawing, the improved method and apparatus of this invention for storing solar energy is generally indicated by the reference numeral 10 and comprises a pair of continuous looped belts 11 and 12 respectively looped into the paths illustrated by being passed around a plurality of rollers, such as rollers 13, 14 and 15 as illustrated, so that two sections 16 of the looped belts 11 and 12 are disposed closely adjacent each other in spaced parallel relation and are adapted to be submerged in a body of liquid 17 as illustrated, the body of liquid 17 being a natural body of water such as a lake, river, ocean, etc., or a man made body of liquid such as is produced in a storage tank, etc.

The upper, substantially horizontal sections 18 of the looped belt means 11 and 12 are respectively disposed outside the body of liquid 17 and are disposed respectively between the rollers 14 and 15 as illustrated.

The sections 18 of the belts 11 and 12 are adapted to be heated by available solar energy, such as by having the rays of the sun concentrated thereon by suitable lens means 19 so that as the sections 18 of the belts 11 and 12 moving continuously or intermittently from the rollers 15 to the rollers 14 will be heated by available solar energy.

The rollers 14 are so constructed and arranged that the same are adapted to have the lower portions thereof rotate in the body of liquid 17 so that the rollers 14 are, in effect, cooled by the body of liquid 17.

When portions of the belts 11 and 12 reach the points 20 on the rollers 14, the outwardly facing sides 21 of the belts 11 and 12 are respectively contacted by electrodes 22 and 23 which are adapted to oppositely charge the sides 21 of the belts 11 and 12 with electrical current that is generated by electricity generating means 24 that is solar operated by available solar energy, such as being produced by a windmill, wave or tide electricity generating means, solar cells, etc.

In any event, it can be seen that the electrical current generating means 24 has a positive lead 25 leading therefrom and being interconnected to the electrode 23 while the negative lead 26 thereof leads to the electrode 22 to electrically charge the belts 11 and 12 at the points 20 on the rollers 14 which are formed of conductive material and thereby are grounded by being rotated in the body of liquid 17 as well as being cooled by conduction from the body of liquid 17.

In this manner, the heated portions of the belts 11 and 12 are charged at the points 20 on the rollers 14 so that by the time the charged portions of the belts 11 and 12 reach the body of liquid 17, the same have been cooled by the rollers 14 through the conductive effect of the body of liquid 17, so that the belts 11 and 12 are changed into electret means before or after the particular part of the belt reaches the body of liquid 17 and is directed toward the rollers 13 thereof.

The electrodes 22 and 23 can be so constructed and arranged and/or the belts 11 and 12 can be so constructed and arranged that the charging operation of the belts 11 and 12 causes the same to each have narrow high intensity transverse bands or sections of electret means 27 spaced from relatively wide transverse bands 28 of charged electret sections as illustrated so that when the adjacent runs 16 of the belts 11 and 12 are brought adjacent each other, a plurality of non-uniform electrostatic fields 29 are formed between adjacent small bands 27 and large bands 28 as illustrated to operate on the body of liquid 17 flowing or disposed between the adjacent runs 16.

It can be seen that the above charging operation causes all of the small and large bands 27 and 28 of the electret sections of the belt 11 to have a negative charge on the side of the belt 11 that faces the adjacent run 16 of the belt 12 and causes all of the small and large bands 27 and 28 of the electret sections of the belt 12 to have a positive charge on the side of the belt 12 that faces the adjacent run 16 of the belt 11 for the reasons set forth in the aforementioned U.S. Pat. No. 3,487,610 to Brown et al.

In this manner, it is believed that particles will be electrostatically separated out of the body of liquid that is disposed between the adjacent runs 16 to be attached onto the sides 21 of the belts 11 and 12 and thereby be carried upwardly out of the body of liquid 17 around the rollers 15 to be scraped and removed therefrom by removing means 30. Thus, the removed electrostatically separated particles can be collected by the removing means 30 for any desired purpose.

Thereafter, the cleaned sections 18 of the belts 11 and 12 are again reheated by the available solar energy through the lens means 19 to again be recharged and changed into electret means in the manner previously described so that a continuous operation is provided for changing the belt means 11 and 12 into electret means by available solar energy and thereafter utilizing such electret means for the useful work of separating particles from the body of liquid 17 through the non-uniform field arrangement 29, the operation of the non-uniform field arrangement 29 being fully described and illustrated in applicant's previously mentioned U.S. Pat. No. 3,966,575 so that further discussion thereof is not necessary.

However, it is to be understood that the belts 11 and 12 could be formed as continuous electret means without the spaced narrow and wide bands 27 and 28 so that the same would provide uniform electrostatic field means between the adjacent runs 16 thereof, if desired.

Also, it is to be understood that each belt 11 and 12 could merely be continuous strip means that are supplied from a supply roll to be heated by the available solar energy and changed into electret means by the solar generating electrical means 24 and thereafter be stored in roll form to be later utilized when desired rather than be thereafter utilized as provided by the electrostatic particle separating means of this invention.

In addition, some of the electrical current from the generating means can be used to operate suitable electrical motors for driving the rollers 13, 14 and 15, and, thus, the belts 11 and 12 in a continuous or intermittent manner for the reasons previously set forth.

Thus, it can be seen that this invention provides a method of changing electret producing material into electret means solely by available solar energy so that the solar energy is stored in the material in the form of electret means that can be subsequently utilized to produce useable work, such as the electrostatic separating means illustrated in the drawing of this invention, whereby the available solar energy need not be transmitted in any form other than by the produced electret means.

Also, it can be seen that such a system 10 could be utilized for cleaning industrial waste by having part of the path for the belts 11 and 12 disposed in a chimney or fluid discharge pipe to continuously electrostatically clean fluid flow (whether gaseous or liquid or both) therethrough with the belts 11 and 12 being driven for up to 24 hours each day to continuously perform their cleaning function while only being recharged by the electrodes 22 and 23 during the useable sunlight and/or wind that particular day or other days because of the long lasting feature of the charge of electret means once the same have been given their particular charge. For example, the length and speed of movement of the belts 11 and 12 may be such that it takes almost all of the useable sunlight for one day to complete the entire charge therefor even though the charged belts thereafter can be continuously useable for several days to perform their electrostatic cleaning function.

While the method of this invention now preferred has been illustrated and described as required by the Patent Statute, it is to be understood that other method steps can be utilized and still fall within the scope of the appended claims.

What is claimed is:

1. A method of storing solar energy in the immediate vicinity of available solar energy comprising the steps of providing a strip of electret producing material, and changing said strip of material into a strip of electret means directly with said available solar energy so that said available solar energy need not be transmitted other than by said electret means, said changing step comprising the step of forming at least one side of said strip of electret means with a repeating serial pattern of a narrow band of electret means transversely across said strip of material and then a wide band of electret means transversely across said strip of material that is spaced from said narrow band of electret means whereby said strip of electret means has each pair of adjacent narrow bands of electret means thereof separated by a wide band of electret means thereof disposed therebetween and spaced therefrom, said forming step comprising the step of causing said bands of said electret means to all have a negative charge or all have a positive charge at said one side of said strip of material.

2. A method as set forth in claim 1 and including the step of subsequently utilizing said strip of electret means to produce work.

3. A method as set forth in claim 2 wherein said step of utilizing said strip of electret means comprises the steps of forming an electrostatic separator unit with said strip of electret means, and separating particles from a fluid with said separator unit.

4. A method as set forth in claim 1 wherein said step of changing said strip of material into said strip of electret means with available solar energy comprises the steps of generating electrical current with said solar energy, and charging said strip of material with said electrical current in the immediate vicinity of said available solar energy to change said strip of material into said strip of electret means.

5. A method as set forth in claim 4 wherein said step of providing said strip of material comprises the step of providing a strip of polarizable material that can be changed into said strip of electret means.

6. A method as set forth in claim 4 wherein said step of generating electrical current with available energy comprises the step of generating electrical current with wind.

7. A method as set forth in claim 4 and including the step of heating said strip of material with available solar energy prior to said step of charging said strip of material so that said strip of material is in a heated condition during the charging thereof.

8. A method as set forth in claim 7 and including the step of cooling said strip of material after said step of charging said strip of material.

9. A method as set forth in claim 8 wherein said step of cooling said strip of material includes the step of cooling said strip of material with a body of liquid.

10. A method as set forth in claim 1 wherein said step of providing a strip of electret producing material comprises the step of providing two looped continuous movable belts of electret producing material, moving said belts in looped paths thereof, generating electrical current with said available solar energy, oppositely charging each belt on one side thereof with said electrical current at certain points in the paths of movement of said belts, heating each belt upstream of said certain points thereof with available solar energy so that said belts will be charged when in a heated condition thereof, cooling said belts with a body of liquid downstream from said certain points thereof whereby said step of changing said strip of material into said strip of electret means comprises the steps of heating, charging and cooling said belts so that belts are changed into two like strips of electret means downstream from said certain points thereof except that said one side of one of said belts has all of the bands of electret means thereof with a positive charge and the other of said belts has all of the bands of electret means on said one side thereof with a negative charge, and electrostatically separating particles from said body of liquid by disposing part of said paths of said belts in adjacent spaced relation in said body of liquid so that an alternating non-uniform electrostatic field arrangement is created between said one side of said electret means of said adjacent spaced paths of said belts, each non-uniform field of said arrangement being created between a narrow band of electret means of one of said belts and a wide band of electret means of the other of said belts whereby said adjacent spaced paths of said belts define a plurality of said non-uniform electrostatic fields therebetween with each field having the higher intensity portion thereof substantially oppositely located relative to the higher intensity portion of an adjacent non-uniform field.

* * * * *